US006992483B1

(12) United States Patent  (10) Patent No.: US 6,992,483 B1
Emeric et al.  (45) Date of Patent: Jan. 31, 2006

(54) METHOD AND SYSTEM TO REGULATE COOLING OF A MEDICAL IMAGING DEVICE

(75) Inventors: Pierre R. Emeric, Milwaukee, WI (US); Carl R. Hedlund, Waterford, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/907,197

(22) Filed: Mar. 24, 2005

Related U.S. Application Data

(63) Continuation of application No. 09/681,467, filed on Apr. 12, 2001, now Pat. No. 6,909,283.

(51) Int. Cl.
*G01V 3/00* (2006.01)
(52) U.S. Cl. .................................... 324/300; 324/306
(58) Field of Classification Search ............... 324/322, 324/318, 307, 309, 321, 320, 319, 300, 306, 324/316
See application file for complete search history.

(56) References Cited

U.S. PATENT DOCUMENTS

| 4,639,672 | A | 1/1987 | Beaumont |
| 5,296,810 | A | 3/1994 | Morich |
| 5,406,204 | A | 4/1995 | Morich et al. |
| 5,424,643 | A | 6/1995 | Morich et al. |
| 5,485,754 | A | 1/1996 | Harpster |
| 5,489,848 | A | 2/1996 | Furukawa |
| 5,793,210 | A | 8/1998 | Pla et al. |
| 6,043,653 | A | 3/2000 | Takamori et al. |
| 6,101,827 | A | 8/2000 | Burson |
| 6,516,282 | B2 * | 2/2003 | Hedlund et al. ............ 702/132 |
| 6,525,537 | B2 | 2/2003 | Nerreter |
| 6,774,632 | B2 * | 8/2004 | Kono ......................... 324/318 |
| 2005/0030028 | A1 * | 2/2005 | Clarke et al. ............... 324/318 |

* cited by examiner

*Primary Examiner*—Brij B. Shrivastasv
(74) *Attorney, Agent, or Firm*—Ziolkowski Patent Solutions Group, SC; Michael A. Della Penna; Carl B. Horton (57) ABSTRACT

The present invention provides a system and method of removing heat from an MR imaging device while maintaining internal and external temperatures below maximum operating limits, thereby enabling higher power applications for faster imaging with improved image quality as well as, allowing longer scan times for interventional procedures. The system includes a vacuum chamber housing the gradient coils and a vacuum pump connected thereto to regulate the pressure and humidity within the chamber. A heat exchanger, coolant pump, and controller are provided to regulate the temperature of coolant designed to dissipate heat from the gradient coils in response to at least one temperature sensor.

20 Claims, 3 Drawing Sheets

METHOD AND SYSTEM TO REGULATE COOLING OF A MEDICAL IMAGING DEVICE

CROSS-REFERENCE TO RELATED APPLICATION

The present application is a continuation of U.S. Ser. No. 09/681,467 filed Apr. 12, 2001 now U.S. Pat. No. 6,909,283.

BACKGROUND OF THE INVENTION

The present invention relates generally to magnetic resonance imaging (MRI) apparatus, and more particularly to, a system and method to provide improved cooling to an MRI apparatus and thereby enable higher power applications for faster imaging with improved image quality and allow longer scan times.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

During patient scans, the gradient coils that produce the magnetic field gradients dissipate large amounts of heat, typically on the order of tens of kilowatts. The majority of this heat is generated by resistive heating of the copper electrical conductors that form the x, y, and z-axis gradient coils when these coils are energized. The amount of heat generated is in direct proportion to the electrical power supplied to the gradient coils. The large power dissipations not only result in increased temperature to the gradient coil, the heat produced is distributed within the gradient coil assembly, or resonance modules, and influences the temperature in two other critical regions. These two regions are located at the boundaries of the gradient assembly and include the patient bore surface and the warm bore surface adjacent to the cryostat that houses the magnets. Each of these three regions has specific maximum temperature limitations. In the resonance module, there are material temperature limitations, such as the glass transition temperature. That is, although the copper and fiber-reinforced backing of the coils can tolerate temperatures in excess of 120° C., the epoxy to bond the layers typically has a much lower maximum working temperature of approximately 70–100° C. On the patient bore surface, regulatory limits mandate a peak temperature on the patient bore surface of 41° C. The warm bore surface also has a maximum temperature that is limited to approximately 40° C. to prevent excessive heat transference through the warm bore surface and into the cryostat. Further, temperature changes of more than 20° C. can cause field homogeneity variations due to a temperature dependence of the field shim material that exhibits a magnetic property variation with temperature.

Typically, the heat produced by the gradient coils in the resonance modules is removed from the gradient assembly by liquid filled cooling tubes embedded in the resonance modules at a given distance from the heat conductors. A liquid coolant, such as water, ethylene, or a propylene glycol mixture, enters the resonance module at a fixed temperature and flow rate, absorbs heat from the gradient coils as it is pumped through the cooling tubes, and transports the heat to a remote heat exchanger/water chiller. Heat is then ejected to the atmosphere by way of the heat exchanger/chiller. For each degree reduction of the coolant temperature as it enters the resonance module, the peak temperatures at each of the three critical regions (resonance module interior, patient bore surface, and warm bore surface) are also lowered.

However, in current systems, the minimum temperature of the coolant supplied to the resonance modules is limited by the dew point temperature of the ambient air. That is, since it is necessary to prevent the water vapor in the air from condensing in the resonance modules in general, and on the gradient coils in particular, the temperature of the coolant must remain above the dew point temperature of the ambient air. The high voltages and currents that are applied to the gradient coils dictates an atmosphere that must be free of such condensation. Current environmental specifications for MR rooms require 75% relative humidity at 21° C., which requires a dew point temperature of 16° C. Therefore, the minimum coolant temperature must be above 16° C. under these conditions.

The maximum power which can be supplied to a resonance module is therefore limited by the external dew point temperature. To increase the power which can be received by the resonance module, it is necessary to lower the minimum coolant temperature. However, as indicated previously, environmental specifications limit the minimum coolant temperature to above 16° C. for an MR room with 75% relative humidity at 21° C. As a result, these current systems are unable to accommodate higher power patient scan sequences often required by resonance modules.

In these known systems, the lowest permissible coolant temperature is dictated by atmospheric conditions or the ambient dew point temperature. With these systems, the coolant temperature is set above the worst case dew point temperature based upon the given temperature and relative humidity specifications in the room housing the MR system.

Further, these systems must be kept from overheating. In case of increased temperatures of the resonance module or the patient surface, imaging scans must be interrupted or limited to low power sequences, which in turn reduces the efficiency and efficacy of the MR system. Time is then lost because imaging sessions cannot begin anew until the resonance module or patient surface cools sufficiently.

It would therefore be desirable to design a method and system to dissipate more heat during imaging scans independent of the aforementioned minimum coolant temperature limitation dictated by the dew point temperature of the ambient air.

BRIEF DESCRIPTION OF THE INVENTION

The present invention provides a system and method overcoming the aforementioned drawbacks by removing heat with lower coolant temperatures in a vacuum chamber containing the gradient and RF coils of an imaging device while maintaining internal and external temperatures below maximum operating limits, thereby enabling higher power applications for faster imaging with improved image quality, as well as, allowing longer scan times for interventional procedures.

A cooling system is provided with improved heat dissipation for an MRI resonance device. The cooling system includes a vacuum enclosure, a set of relative humidity, temperature and pressure sensors, and a control system that dynamically adjusts the temperature of coolant in cooling tubes embedded in the resonance module. The cooling fluid increases in temperature as it absorbs heat from the resonance module and transports the heat to a remote heat exchanger, such as, a water chiller. Since air and water vapor are removed from the vacuum enclosure containing the resonance module, condensation is prevented in the evacuated enclosure. As a result, the coolant temperature may be adjusted as needed to remove heat and maintain gradient coil temperatures within allowable levels.

Moreover, to further enhance proper operation and reliability, pressure and relative humidity sensors are placed in the vacuum enclosure to monitor for air and/or coolant leakage. To prevent condensation of water vapor on the exterior surfaces of the gradient coil, temperature sensors are installed on the patient and warm bore surfaces and in the vacuum enclosure. The control system is configured to provide the lowest practical coolant temperature while simultaneously preventing condensation on the patient and warm bore surfaces. Additionally, the relative humidity and pressure sensors may be used to trigger an alarm and disable the gradient coil drivers in response to an anomalous operating condition.

In accordance with one aspect of the present invention, a system for cooling electrical coils is provided. The system includes a coiling tube assembly for transferring heat from at least one electrical coil via a coolant traveling through the coil assembly and a heat exchanger for receiving the coolant from the cooling tube assembly. The heat exchanger is configured to remove heat from the coolant received from the cooling tube assembly. An enclosure is also provided and includes the cooling tube assembly therein. The enclosure is designed to have an internal dew point less than that of a surrounding atmosphere. A control system receives feedback indicative of operating conditions of the electrical coil and in response thereto, provides control signals to a chiller in order to dynamically adjust coolant temperatures.

In a further aspect of the present invention, a cooling system for an MRI device includes a set of coolant tubes in thermal contact with a set of gradient coils of the MR device and having a coolant pass therethrough. A heat exchanger is connected to the set of coolant tubes and configured to remove heat entrained in the coolant. A vacuum chamber encloses the set of coolant tubes. At least one temperature sensor is provided that is in a thermal contact to sense temperature of the MR device and a humidity sensor is positioned to sense humidity in the vacuum chamber. The system includes a controller connected to receive temperature indicative signals from the temperature sensor and control coolant temperature in response thereto.

In yet another aspect of the present invention, an MRI apparatus is provided and includes a magnetic resonance imaging (MRI) system having a plurality of gradient coils. The gradient coils are configured to be positioned about a bore of a magnet to impress a polarizing magnetic field. The MRI system further includes an RF transceiver system and an RF switch controlled by a pulse module to transmit RF signals to an RF coil assembly to acquire MR images. The MRI apparatus also includes a cooling system to dissipate heat from the plurality of gradient coils. The cooling system includes a temperature sensor positioned to sense gradient coil temperature and a set of coolant tubes having a coolant pass therethrough and in thermal contact with the gradient coils of the MR system. A heat exchanger is connected to the coolant tubes to remove heat from the coolant wherein the coolant tubes are enclosed by a vacuum chamber. A vacuum pump connected to the vacuum chamber is provided to maintain a vacuum within the chamber. The MRI apparatus also includes at least one pressure sensor configured to sense pressure within the vacuum chamber. A control is connected to receive signals from the pressure sensor and to send control signals to the vacuum pump. The control is also connected to receive signals from the temperature sensor to control a coolant temperature in response. In this manner, the system is able to maintain a steady gradient coil temperature by varying the coolant temperature.

In yet a further aspect of the present invention, a method of cooling an MRI device is also provided. The method includes the steps of creating a sealed enclosure about a set of gradient coils and removing moisture from the sealed enclosure. The method also includes the step of recirculating a coolant through a series of cooling tubes in the sealed enclosure and through a heat exchanger. Next, an indication of gradient coil temperature is monitored during MR operation and the temperature of the coolant is adjusted in response to the indication of gradient coil temperature.

Various other features, objects and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
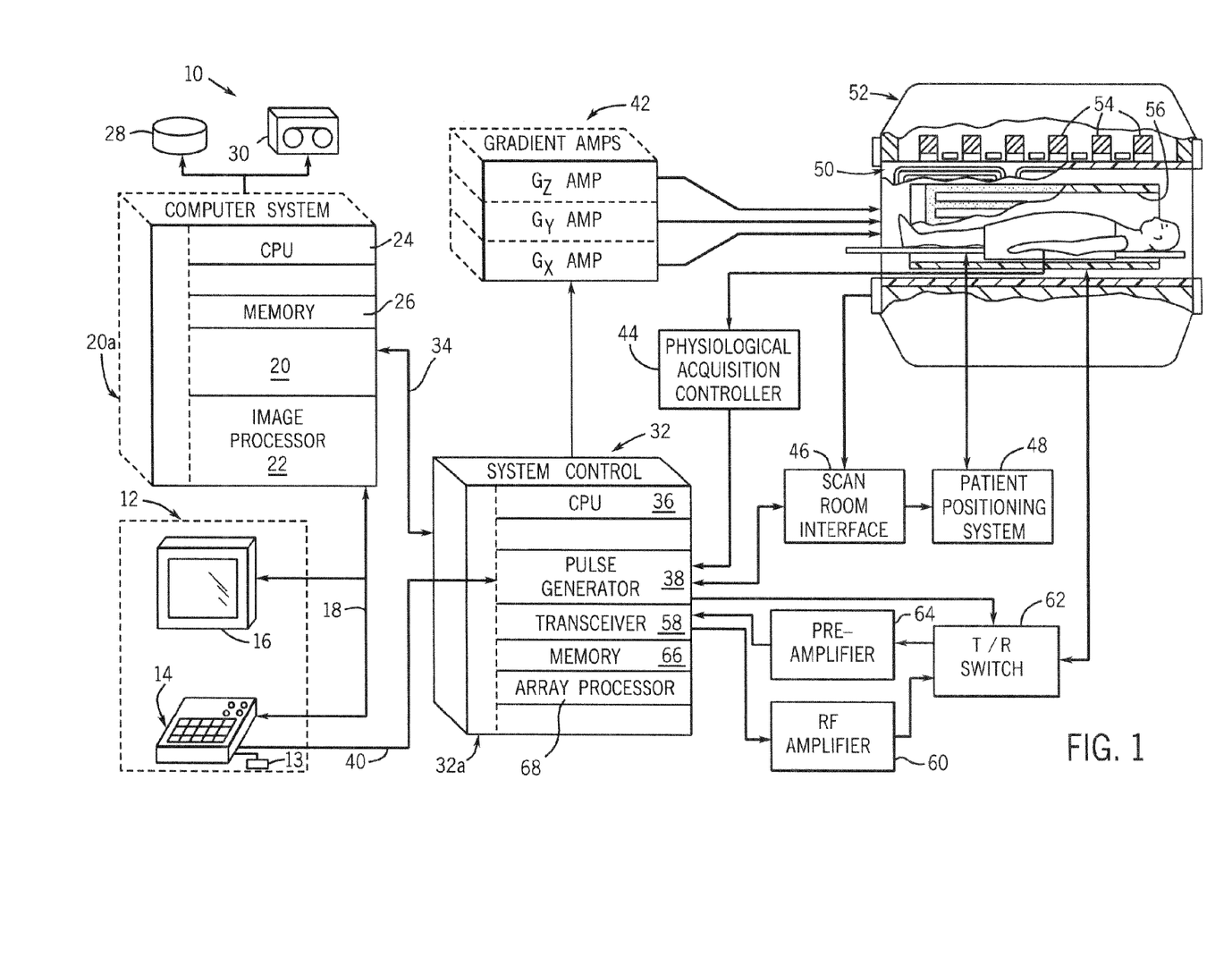
FIG. 1 is a schematic block diagram of an MRI imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display 16. The console 12 communicates through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention provides a system and method to improve heat removal from the gradient coil housing, or resonance module, of an imaging device while maintaining internal and external temperatures below maximum operating limits, thereby enabling higher power applications for faster imaging with improved image quality as well as, allowing longer scan times for interventional procedures.

Figure 2:
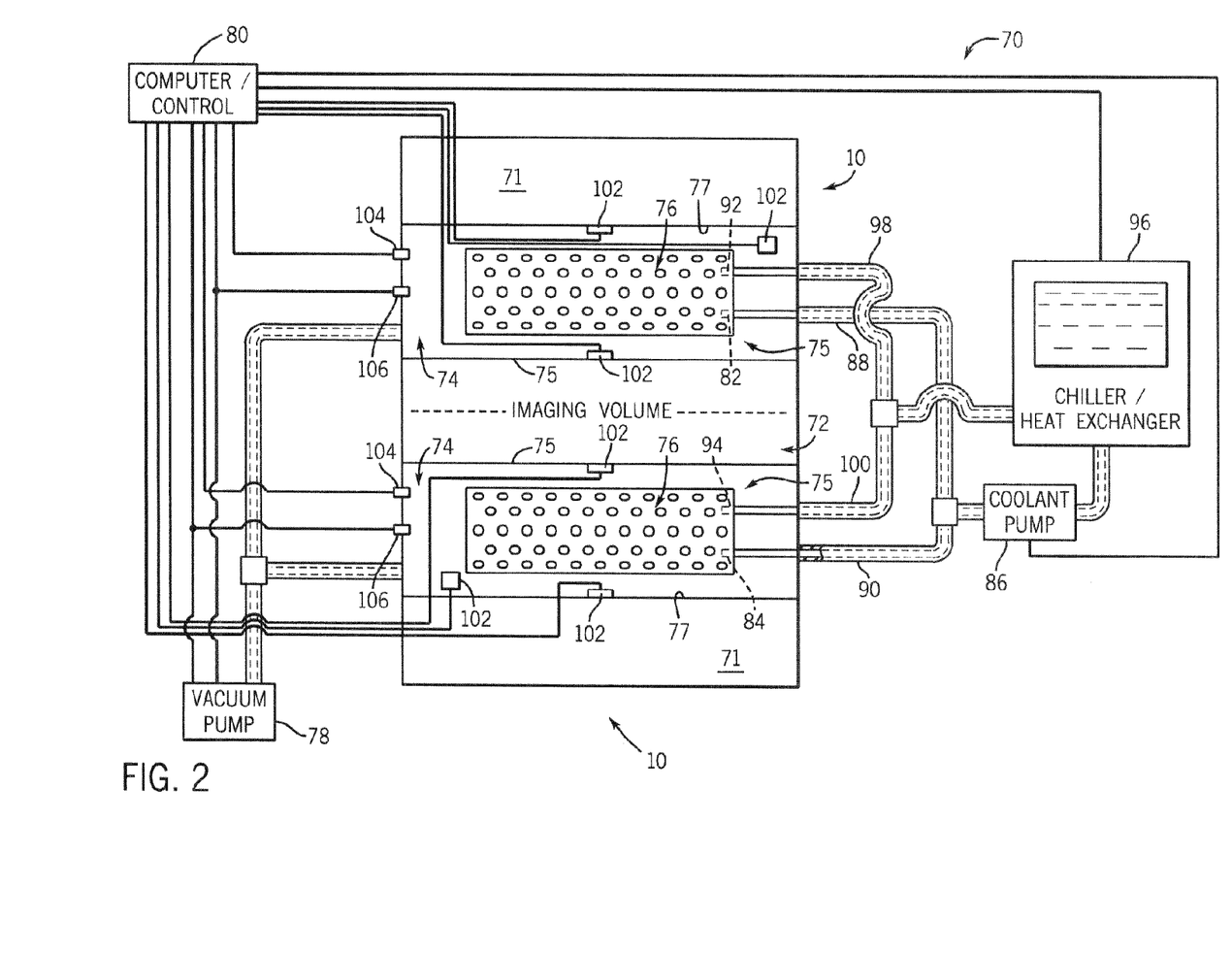
FIG. 2 is a schematic drawing of a cooling system for use with the MRI imaging system shown in FIG. 1.

Referring to FIG. 2, a cooling system 70 is provided and configured to reduce heat generated by the gradient coils of a magnetic resonance imaging (MRI) system 10. Dissipating heat generated within an MRI device 10 is paramount to avoid overheating and potential damage to the gradient coils. The MRI device 10 includes a cryogenic tank 71 to house the main magnet (not shown) and an imaging volume space 72 for a subject, such as, a medical patient, to be placed to undergo an imaging session. The imaging volume is defined by a vacuum pumped enclosure, or resonance module, 74 configured to house the gradient coils and the RF coils. As indicated previously, the gradient coils are excited by a corresponding gradient amplifier to produce magnetic field gradients used for spatially encoding signals acquired by the RF coils used to reconstruct an image in a known manner.

Further enclosed in vacuum chamber 74 are a number of cooling tubes 76 configured to circulate liquid coolant, such as water, ethylene, or a propylene glycol mixture, to reduce heat generated by the excitation of the gradient coils. When generating the magnetic field gradients, the gradient coils, as a result of the resistive effects of their copper composition, generate considerable heat, typically on the order of tens of kilowatts, which must be dissipated to ensure proper operation of the MRI system 10. To assist in heat dissipation, coolant is circulated through the cooling tubes 76 embedded in resonance module 74, as will be discussed shortly.

As indicated previously, resonance module 74 is maintained in a vacuous state. Enclosing resonance module 74 in a vacuum operates to expunge any air and water vapor accumulating in the resonance module. As is well known, circulating a liquid having a temperature less than the temperature of the surrounding environment may result in condensation forming in the resulting environment. That is, circulating coolant through tubes 76 to dissipate heat from the gradient coils in a non-vacuous chamber could result in condensation forming on the surface of the gradient coils if the coolant temperature is below the dew point in the chamber. Since condensation cannot be allowed to form on the surface of the gradient coils, preexisting cooling systems have maintained the temperature of the coolant above the dew point.

Maintaining a vacuous state within the enclosed vacuum chamber 74 eliminates the possibility of condensation on the gradient coils of the MR apparatus. The present invention provides a vacuum pump 78 in flow communication with each vacuum chamber 74. The vacuum pump is configured to frequently expunge any air and/or moisture in the vacuum chamber 74 by maintaining a vacuum condition of approximately $10^{-1}$ to $10^{-2}$ torr. Vacuum pump 78 is controlled by a control system, such as a computer or controller 80 that is configured to control the operation of the vacuum pump 78. That is, computer/controller 80 may signal the vacuum pump to decrease or increase the pressure within the enclosure 74. Still referring to FIG. 2 and as indicated previously, condensation may form on the surface of the gradient coils in response to the circulation of coolant that is below the ambient dew point if not for a consistent vacuous state within chamber 74. Coolant enters the resonance module or chamber 74 via inlet ports 82 and 84. Coolant is fed to the resonance module 74 by a coolant pump 86 which is fluidly connected to inlet ports 82, 84 via external fluid lines 88 and 90. To assist in maintaining the desired coolant temperature, coolant lines 88 and 90 are sufficiently insulated to limit any variance in coolant temperature as it enters the vacuum pumped resonance module 74 and avoid condensation in non-vacuous areas. Although two inlet and outlet ports for the coolant are shown in FIG. 2, in other embodiments, there may be just one, since the cooling tubes 76 are circular around the imaging volume 72, or there may be more than two to provide more consistent flow circulation.

Coolant pump 86 circulates coolant at a temperature dependent on system needs and, in accordance with the present invention, at a coolant temperature independent of the dew point temperature of the ambient. By removing any moisture in the vacuum enclosure 74, the coolant may be input through ports 82 and 84 at any desired temperature. That is, the condensation effects resulting from the relationship between coolant temperature and the ambient temperature are negated by the evacuation of moisture from the vacuum enclosure 74 by the vacuum pump 78 and an appropriate control 80.

Coolant entering the resonance module 74 travels through cooling tubes 76 and while doing so absorbs heat from the coils. The coolant carrying the heat entrained therein away from the gradient coils exits the vacuous resonance module 74 through outlet ports 92 and 94 which transports the heated coolant to a chiller/heat exchanger 96 via return lines 98, 100. Chiller 96 is configured to dissipate heat absorbed in the coolant using a heat exchanger and a compressor (not shown) in a known technique and lower the coolant temperature to a desired temperature dictated by the computer/control 80.

Operation of chiller 96 is controlled by computer/control 80 to drive the temperature of the liquid coolant to a desired value. Regulation of the coolant temperature in accordance with the present invention allows for dynamic adjusting of the coolant temperature to keep the patient surface and other resonance module temperatures, such as, the warm bore surface temperature adjacent to the resonance module, within specified limits. That is, if the heat dissipation requirements increase, the temperature of the coolant may be decreased below the dew point temperature if necessary. Further, if the heat or power dissipation needs are reduced, the temperature of the coolant may be allowed to increase thereby decreasing the amount of energy exerted by the chiller 96. As a result, down times of the MRI apparatus 10 to allow the system to cool are avoided, and further, the MRI apparatus 10 may be implemented with applications and imaging sequences requiring higher power input to the gradient coils. A method to regulate the coolant temperature will be discussed with particular reference to FIG. 3.

Still referring to FIG. 2, a number of operation sensors are provided to monitor the temperature, pressure, and relative humidity of the vacuum enclosure 74 and various surfaces of the MR apparatus 10. Temperature sensors 102 are placed to measure the temperature of the resonance module 74, the patient surface 75 and the warm bore surface 77. Further, pressure and relative humidity sensors 104, 106 are positioned within the resonance module 74 to measure the vacuum pressure and condensation properties within the resonance module 74. The sensed relative humidity and pressure are transmitted to the computer/control 80 which in turn transmits control signals to vacuum pump 78 to increase or decrease the pressure in the resonance module 74. Temperature sensors 102 transmit temperature data of the resonance module 74, patient bore surface 75, and the warm bore surface 77. In response to the received temperature signals, computer 80 transmits control signals to chiller 96. As the temperature of the bore surfaces and the resonance module 74 increase, the computer/control 80 transmits instructions to the chiller 96 to adjust the temperature of the liquid coolant flowing to the resonance modules 74. Alternatively or in conjunction with temperature adjustment, as the need to dissipate heat from the gradient coils changes, the computer/control 80 may also adjust the flow rate of coolant pump 86 to increase or decrease temperatures in the MR device 10 to a desired temperature. Furthermore, the temperature, pressure, and relative humidity sensors 102, 104, 106 may also be implemented to trigger the computer/control 80 to disable the gradient coil drivers if an anomalous condition is detected.

Figure 3:
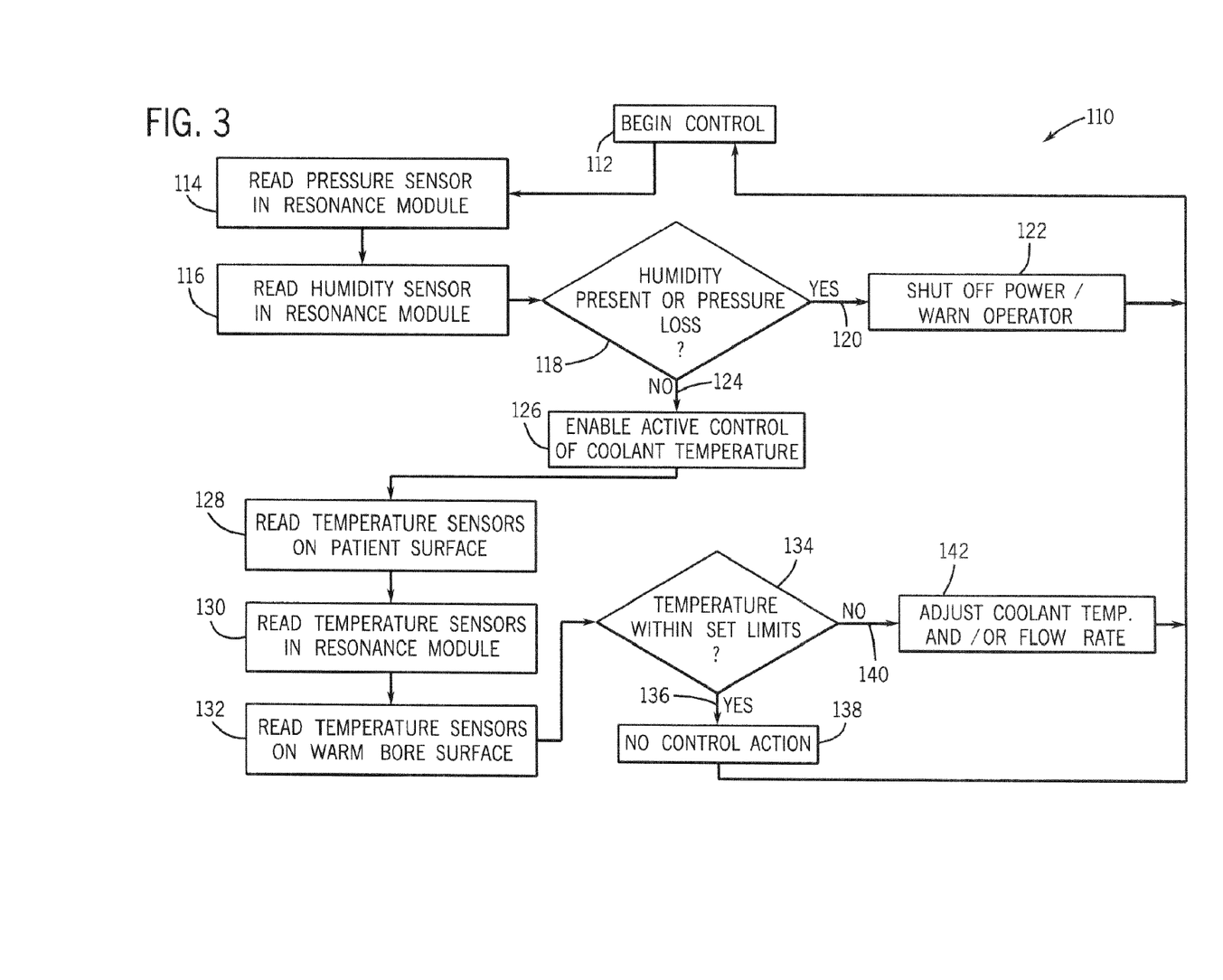
FIG. 3 is a flow chart illustrating the steps of a thermal control technique for use with the present invention.

Referring to FIG. 3, an algorithm 110 is provided to dynamically regulate coolant temperature for dissipating heat generated by excitation of the gradient coil assembly. Algorithm 110 begins at 112 with reading the pressure within the resonance module 114 and the humidity 116, and if either the pressure sensor or the humidity sensor indicates a loss of pressure or a certain level of humidity within the resonance module 118, 120, power to the gradient coils is limited and the system is shut down and sends a warning to the operator 122, at which time the system is capable of looping back to the beginning of the control 112 and continually monitoring the pressure and humidity. If there is no humidity present, nor a pressure loss, 118, 124 active control of coolant temperatures is enabled 126, which includes reading temperature signals from the temperature sensors on the patient surface 128, in the resonance module 130, and on the warm bore surface 132. If all the temperatures are within set limits 134, 136, no action is required 138 and the control algorithm loops back to the beginning 112 and continues as previously described. However, if the temperatures are not within the set limits 134, 140, the coolant temperature is adjusted 142 as dictated by the temperatures sensed at the patient surface, in the resonance module, and on the warm bore surface. Alternatively, or in conjunction therewith, the flow rate of the coolant can also be adjusted 142. After the adjustment of the coolant and/or the flow rate 142, the system loops back to the beginning of the algorithm 112 and continually repeats the aforementioned sequence of instructions.

Once the new coolant inlet temperature and/or flow rate is determined, the coolant temperature is adjusted by the chiller or heat exchanger 96, FIG. 2, and/or the coolant flow rate is adjusted by the coolant pump 86, FIG. 2. Although the coolant temperature and/or flow rate have been adjusted to maintain a maximum and minimum temperature within a specified range, the control process of the present invention is configured to continually monitor the temperatures so that further adjustments to the coolant temperature and/or flow rate may be made to maintain the temperature range within specified requirements. After the scanning is complete the coolant inlet flow rate and coolant temperatures can be reset to default values.

The present invention includes a system for cooling electrical coils that includes a cooling tube assembly for transferring heat from at least one electrical coil via a coolant traveling through the cooling tube assembly. A heat exchanger is further provided for receiving the coolant from the cooling tube assembly and removing heat therefrom. The system also includes an enclosure having a cooling assembly therein and having an internal dew point less than that of a surrounding atmosphere. A control system receives feedback indicative of operating conditions of the electrical coil and in response thereto, provides signals to the heat exchanger to dynamically adjust coolant temperature.

In a further embodiment of the present invention, a cooling system for an MRI device includes a set of coolant tubes in thermal contact with a set of gradient coils of the MRI device and having a coolant pass therethrough. A heat exchanger is connected to the set of coolant tubes to remove heat from the coolant and a vacuum chamber enclosing the set of coolant tubes. The system also includes at least one temperature sensor in thermal contact to sense temperature of the MR device and a humidity sensor positioned to sense humidity in the vacuum chamber. A controller is connected to receive temperature indicative signals from the temperature sensor and control coolant temperature in response thereto.

In yet a further embodiment of the present invention, an MRI apparatus is provided and includes a magnetic resonance imaging system having a plurality of gradient coils positioned about a bore of a magnet to impress a polarizing magnetic field. The magnetic resonance imaging system further includes an RF transceiver system and an RF switch controlled by a pulse module to transmit RF signals to an RF coil assembly to acquire MR images. The MRI apparatus also includes a cooling system having a temperature sensor positioned to sense an indication gradient coil temperatures, a set of coolant tubes having a coolant pass therethrough and in thermal contact with the gradient coils of the MRI system, and a heat exchanger connected to the coolant tubes to remove heat from the coolant. A vacuum chamber encloses the coolant tubes and has a vacuum pump connected thereto. At least one pressure sensor is provided and connected to sense pressure within the vacuum chamber. The MRI apparatus further includes a control connected to receive signals from the pressure sensor and send signals to the vacuum pump to control and maintain a vacuum within the vacuum chamber. The control is also connected to receive signals from the temperature sensor and control the coolant temperature in response, thereby maintaining a steady temperature in and around the resonance module.

In a further embodiment of the present invention, a method of cooling an MRI includes the step of creating a sealed enclosure about a set of gradient coils. The method further includes the steps of removing moisture from the sealed enclosure and recirculating a coolant through a series of cooling tubes in the sealed enclosure and through a heat exchanger. Next, a representation of gradient coil temperature is monitored during MRI operation. Further, the method includes the step of adjusting the temperature of the coolant in response to the representation of gradient coil temperature.

The present invention is particularly adaptable to retrofitting existing MR scanners, and accordingly includes a coolant control system kit adaptable to an MR device that includes a humidity sensor positioned to sense humidity in a resonance module and at least one temperature sensor in thermal contact to sense temperature of a portion of the MR device. The kit also includes a controller connected to receive temperature indicative signals from the temperature sensor and control coolant temperature in response thereto.

The present invention has been described in terms of the preferred embodiment, and it is recognized that equivalents, alternatives, and modifications, aside from those expressly stated, are possible and within the scope of the appending claims.

What is claimed is:

1. An MRI apparatus comprising:
   a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and
   a coolant circulation system configured to circulate coolant in thermal contact with the gradient coils of the MR system and at a coolant temperature that is less than an ambient dew point temperature.

2. The MRI apparatus of claim 1 wherein the coolant circulation system is further configured to circulate coolant at a variable flow rate.

3. The MRI apparatus of claim 1 wherein the coolant circulation system further has:
   a heat exchanger connected to a set of coolant tubes to remove heat from the coolant;
   a vacuum chamber enclosing the coolant tubes;
   a vacuum pump connected to the vacuum chamber;
   at least one pressure sensor connected to sense pressure within the vacuum chamber; and
   a controller connected to receive signals from the pressure sensor and send signals to the vacuum pump to control and maintain a vacuum within the vacuum chamber, and connected to receive signals from the temperature sensor and control coolant temperature independent of the ambient dew point temperature.

4. The MRI apparatus of claim 3 wherein the coolant circulation system further comprises:
   a set of coolant supply/return lines having thermal insulation thereover and connecting the heat exchanger to the set of coolant tubes; and
   a humidity sensor positioned to sense humidity in the vacuum chamber and connected to the controller, the controller programmed to limit power to the gradient coils if the sensed humidity in the vacuum chamber exceeds a humidity set point.

5. The MRI apparatus of claim 3 wherein the coolant circulation system further comprises a first temperature sensor in thermal contact with a patient bore surface of the NMR system, a second temperature sensor in thermal contact with a resonance module, and a third temperature sensor in thermal contact with an outer bore surface.

6. The MRI apparatus of claim 3 wherein the coolant circulation system further comprises a coolant flow control valve connected to receive control signals from the controller to adjust coolant flow.

7. The MRI apparatus of claim 1 wherein the coolant circulation system further comprises a variable rate coolant pump that pumps coolant at a variable flow rate.

8. The MRI apparatus of claim 7 wherein the coolant circulation system further comprises a chiller to chill the coolant to a desired temperature and further comprises a controller that commands the chiller based on operating conditions of the gradient coils.

9. A cooling system of a medical imaging device, the cooling system comprising:
   an enclosure having a cooling tube assembly for circulating coolant in thermal contact with an electrical coil so as to transfer heat from the electrical coil and having an internal dew point less than that of a surrounding atmosphere; and
   a controller that monitors operation of the electrical coil and, if operation will result in condensation in the enclosure, cause a change in coolant flow rate of coolant circulating through the cooling tube assembly.

10. The cooling system of claim 9 further comprising a humidity removal device connected to the enclosure for removing humidity therefrom and maintaining the enclosure under a negative pressure.

11. The cooling system of claim 10 wherein the humidity removal device includes:
- a vacuum pump for removing humidity from the enclosure;
- a pressure sensor for monitoring internal pressure in the enclosure; and
- a controller for monitoring the internal pressure in the enclosure and controlling the vacuum pump in response thereto.

12. The cooling system of claim 9 wherein the medical imaging device is an MRI scanner and wherein the controller controls temperatures within a resonance module, on a patient bore surface, and on a warm bore surface adjacent to a magnet enclosure.

13. The cooling system of claim 9 wherein the controller is further configured to:
- receive temperature feedback of the electrical coil from a temperature sensor;
- receive humidity feedback of humidity within the enclosure from a humidity sensor; and
- control dew point in the enclosure in response to the humidity within the enclosure and control the electrical coil temperature in response to the temperature feedback of the electrical coil.

14. The cooling system of claim 13 wherein the controller is further configured to cause dynamic adjustment of coolant temperature and coolant flow rate out of a chiller to maintain a relatively constant electrical coil temperature.

15. A controller configured to:
- circulate coolant through a series of cooling tubes in a sealed enclosure having a set of gradient coils therein;
- monitor operation of the gradient coils during an MR scan; and
- adjust a rate at which coolant is circulated through the series of cooling tubes so as to effectuate a desired change in coolant temperature based on operation of the gradient coils.

16. The controller of claim 15 further configured to:
- receive an indication of gradient coil temperature in real-time during the MR scan; and
- adjust coolant flow rate to lower coolant temperature below an ambient dew point if operation of gradient coils requires additional power levels.

17. The controller of claim 16 further configured to:
- monitor a humidity level in the sealed enclosure; and
- limit power to the gradient coils if the coolant temperature needed would create condensation in the sealed enclosure based on the humidity level monitored.

18. The controller of claim 15 further configured to control operation of a vacuum pump such that a vacuum is created in the sealed enclosure.

19. The controller of claim 15 further configured to cause circulation of coolant at a coolant temperature lower than 16 degrees Celsius when the MR scan is carried out in an ambient temperature of 21 degrees Celsius and an ambient relative humidity of 75 percent.

20. The controller of claim 15 further configured to cause adjustment of coolant temperature and coolant flow rate to prevent condensation within the sealed enclosure.

* * * * *

UNITED STATES PATENT AND TRADEMARK OFFICE
CERTIFICATE OF CORRECTION

PATENT NO. : 6,992,483 B1 Page 1 of 1
DATED : January 31, 2006
INVENTOR(S) : Emeric et al.

It is certified that error appears in the above-identified patent and that said Letters Patent is hereby corrected as shown below:

<u>Column 10,</u>
Line 38, delete "NMR" and substitute -- MRI --.

Signed and Sealed this

Eighteenth Day of April, 2006

JON W. DUDAS
*Director of the United States Patent and Trademark Office*